(12) United States Patent
Sade et al.

(10) Patent No.: US 11,204,312 B2
(45) Date of Patent: Dec. 21, 2021

(54) IN-SITU FULL WAFER METROLOGY SYSTEM

(71) Applicant: Applied Materials, Inc., Santa Clara, CA (US)

(72) Inventors: Ami Sade, Sunnyvale, CA (US); Todd Egan, Fremont, CA (US); Shay Assaf, Gilroy, CA (US); Jacob Newman, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/818,499

(22) Filed: Mar. 13, 2020

(65) Prior Publication Data

US 2021/0285865 A1 Sep. 16, 2021

(51) Int. Cl.
*G01N 21/01* (2006.01)
*G01B 11/06* (2006.01)
*G01N 21/21* (2006.01)
*G01N 21/55* (2014.01)

(52) U.S. Cl.
CPC ......... *G01N 21/01* (2013.01); *G01B 11/0625* (2013.01); *G01B 11/0641* (2013.01); *G01N 21/211* (2013.01); *G01N 21/55* (2013.01); *G01N 2021/0106* (2013.01)

(58) Field of Classification Search
CPC ............ G01B 11/0625; G01B 11/0641; G01N 21/211; C23C 14/50; H01L 21/67253; B65D 41/04
See application file for complete search history.

(56) References Cited

U.S. PATENT DOCUMENTS

| | | | | | |
|---|---|---|---|---|---|
| 5,463,459 | A | * | 10/1995 | Morioka | B82Y 15/00 257/E21.53 |
| 2003/0062578 | A1 | * | 4/2003 | Dougan | H01L 21/67253 257/414 |
| 2003/0147076 | A1 | * | 8/2003 | Bowman | G01N 21/211 356/369 |
| 2006/0203231 | A1 | * | 9/2006 | Uto | G01N 21/94 356/237.2 |
| 2006/0250611 | A1 | * | 11/2006 | Velidandla | H01L 22/12 356/237.2 |
| 2013/0141711 | A1 | * | 6/2013 | Hines | H01L 21/68764 356/28 |
| 2018/0114712 | A1 | * | 4/2018 | Hung | H01L 21/02636 |
| 2018/0263854 | A1 | * | 9/2018 | Taylor | A61J 7/0436 |
| 2018/0361728 | A1 | | 12/2018 | Philippi | |
| 2019/0171181 | A1 | * | 6/2019 | Nurani | H01L 21/67253 |
| 2020/0180845 | A1 | * | 6/2020 | MokhtarzadehBahadorani | B65D 81/386 |

FOREIGN PATENT DOCUMENTS

KR 20060078838 A 7/2006

* cited by examiner

*Primary Examiner* — Maurice C Smith
(74) *Attorney, Agent, or Firm* — Servilla Whitney LLC

(57) ABSTRACT

Full wafer in-situ metrology chambers and methods of use are described. The metrology chambers include a substrate support and a sensor bar that are rotatable relative to each other. The sensor bar includes a plurality of sensors at different radii from a central axis.

17 Claims, 6 Drawing Sheets

US 11,204,312 B2

IN-SITU FULL WAFER METROLOGY SYSTEM

TECHNICAL FIELD

Embodiments of the present disclosure generally relate to semiconductor manufacturing apparatus. More particularly, embodiments of the disclosure relate to in-situ full wafer metrology systems.

BACKGROUND

Wafer and film deposition are frequently evaluated during semiconductor manufacturing. It is helpful during manufacturing to evaluate the progress of a film deposition process (e.g., thickness) or properties of the film (e.g., density). The ability to determine these, and other film parameters, can decrease defect rates and improve the overall throughput of the manufacturing process, as long as the metrology does not take too much time.

The current metrology solutions include stand-alone metrology tools which provide good solutions if the layers are not sensitive to oxidation, or if the measurement is performed on the top layer. The stand-alone meteorology systems are atmospheric or the system that are in-situ do not provide or allow for full wafer coverage. If the requirement is to measure in-vacuum or between layers, a fixed-position metrology system is used. Current metrology technology uses several single point measurements to determine thickness and material properties. Some current systems use up to 625, or more, individual measurement points to evaluate the film uniformity across the wafer. The fixed-position stations cannot delivery full wafer uniformity information.

Accordingly, there is a need for apparatus to determine full wafer metrology without breaking vacuum.

SUMMARY

One or more embodiments of the disclosure are directed to in-situ metrology chambers comprising a chamber body having a bottom and sidewalls bounding an inner volume. The sidewalls have an opening formed therethrough. A sensor lid bounds the inner volume and has an inside surface and an outside surface. A substrate support is within the inner volume and has a support surface facing the inside surface of the sensor lid. A sensor bar is connected to the sensor lid. The sensor bar comprises a plurality of sensors facing the support surface of the substrate support. The plurality of sensors is positioned along the sensor bar at different radii from a central axis. One of the sensor bar or substrate support is configured to rotate around the central axis relative to the other of the sensor bar or substrate support.

Additional embodiments of the disclosure are directed to non-transitory computer readable medium including instructions, that, when executed by a controller of a metrology chamber, causes the chamber to perform one or more operations selected from: rotating one of a substrate support or sensor bar around a central axis relative to the other of the substrate support or sensor bar; obtain data from a plurality of sensors during rotation of the substrate support to generate a radial-position rotation-angle dependent data profile for each sensor at different radii; and extrapolate data at a position between sensor radii from the radial-position rotation-angle dependent data profiles.

Further embodiments of the disclosure are directed to methods of measuring a film on a substrate. One of a substrate support or sensor bar is rotated around a central axis relative to the other of the substrate support or sensor bar. Data from the substrate is collected using at least one sensor positioned on the sensor bar. The at least one sensor is configured to measure the film on the substrate and generate radial-position rotation-angle dependent data profile from each sensor. A property of the film is determined over the substrate based on the radial-position rotation-angle dependent data profiles.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
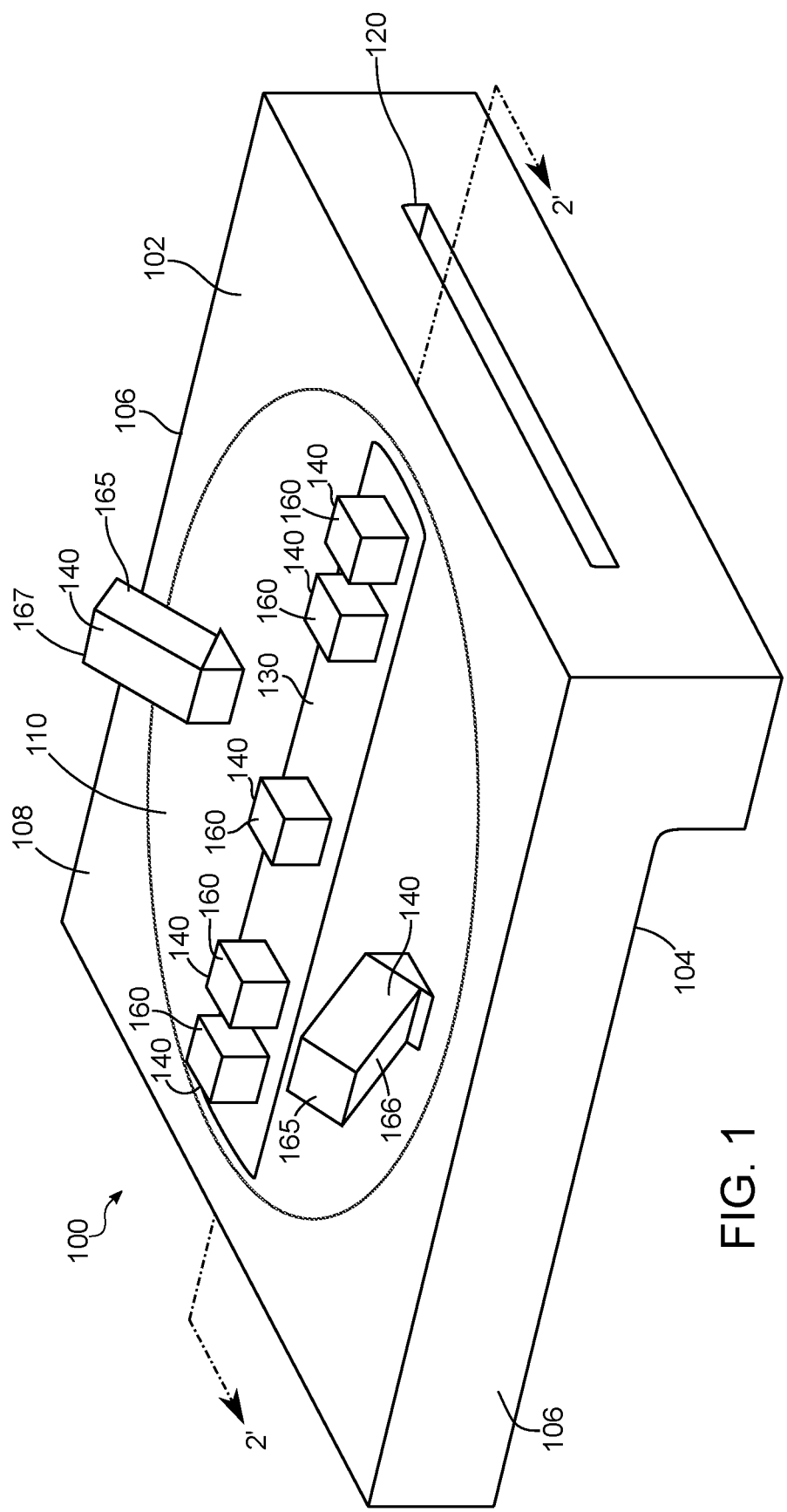
FIG. 1 shows an isometric view of an in-situ metrology chamber according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an under layer formed on the substrate as disclosed in more detail below, and the term "substrate surface" is intended to include such under layer as the context indicates. Thus for example, where a film/layer or partial film/layer has been deposited onto a substrate surface, the exposed surface of the newly deposited film/layer becomes the substrate surface.

One or more embodiments of the disclosure are directed to metrology systems with one or more reflectometers and/or ellipsometers on a chamber lid. Relative rotation of a wafer with respect to the chamber lid provides full wafer thickness map and material properties. Some embodiments advantageously provide apparatus to extend the capability of current systems to full wafer meteorology systems and provide in-situ uniformity mapping.

One or more embodiments of the disclosure advantageously allow for the full metrology of a wafer without breaking vacuum. In-situ monitoring of some embodiments allows measurement in cases were the layers are sensitive to oxygen or other time effects or if the measurement should be done between layers without braking vacuum.

Some embodiments of the disclosure provide a combination of reflectometers on the diameter of the wafer and rotation provides highly populated uniformity maps (up to 1801 points) generated within minutes. In some embodiments, one or more ellipsometer is positioned off-center to provide material composition information. One or more embodiments advantageously provide apparatus that provide thickness uniformity maps in-vacuum, with accuracy of down to 0.1 A within minutes.

Some embodiments operate at room temperature or without specific temperature control. A hot wafer can be loaded into the metrology chamber and analyzed before the wafer significantly cools, or cools to the point of affecting measurement reliability. In some embodiments, the wafer temperature is controlled using a heater. In some embodiments, the wafer temperature is monitored using one or more temperature measurement system known to the skilled artisan. Some embodiments calibrate out temperature effects by measuring the temperature directly with an IR camera or using the reflectometer signal to measure and correct for the wafer temperature.

Figure 2:
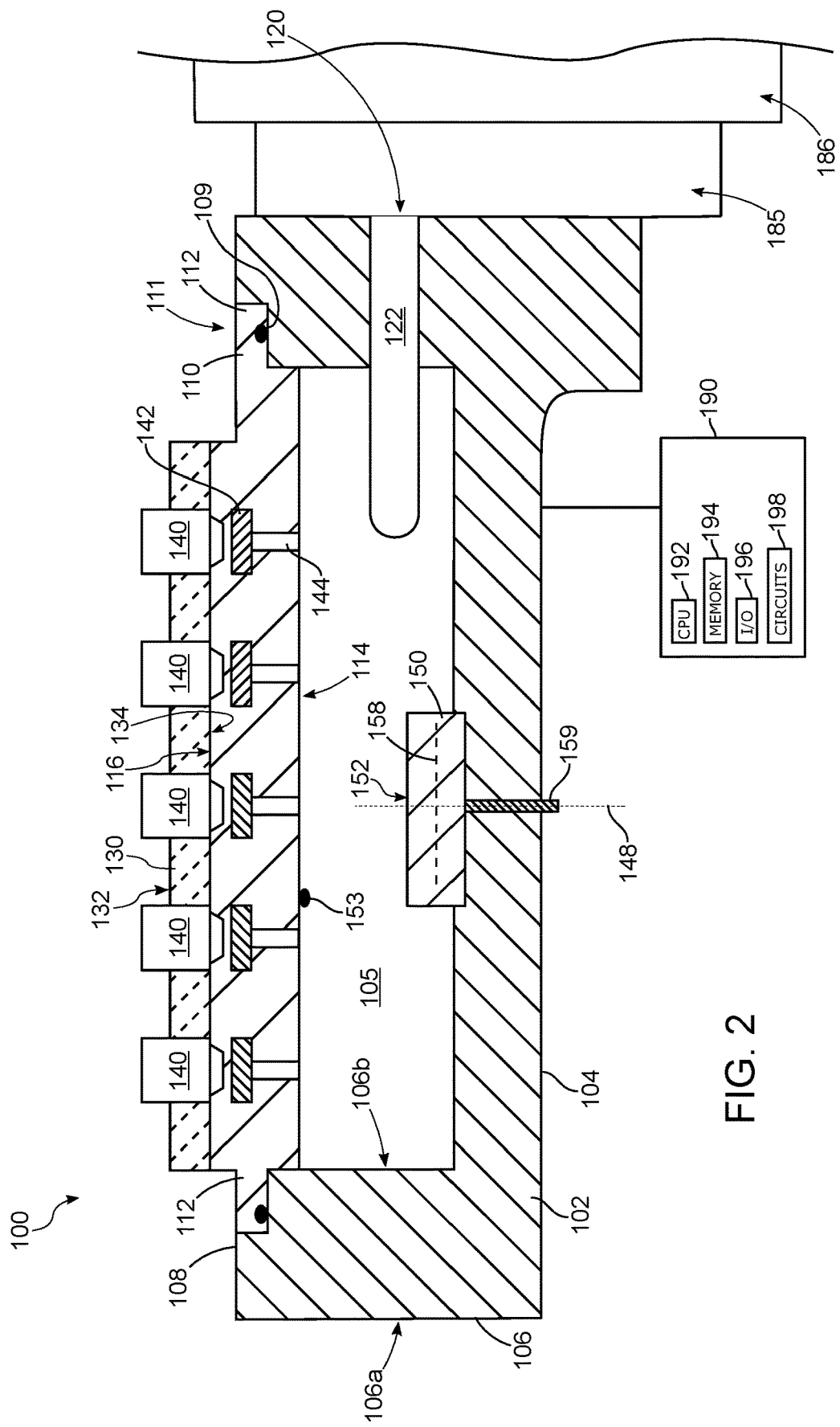
FIG. 2 illustrates a cross-sectional view of the in-situ metrology chamber of FIG. 1 taken along line 2-2'.

FIG. 1 illustrates an isometric view of an in-situ metrology chamber 100 according to one or more embodiment of the disclosure. FIG. 2 illustrates a cross-sectional view of the in-situ metrology chamber 100 of FIG. 1 taken along line 2-2'.

The in-situ metrology chamber 100 comprises a chamber body 102 with a bottom 104 and at least one sidewall 106. The chamber body 102 and at least one sidewall 106 bound an inner volume 105 of the chamber 100. The embodiment illustrated in FIGS. 1 and 2 show a chamber 100 with four sidewalls 106. The skilled artisan will recognize that the shape of the sidewalls 106 and/or the number of sidewalls 106 can be any suitable shape or number and does not limit the scope of the disclosure. In some embodiments, the outside shape 106a of the body 102 is different than the inside shape 106b of the body 102. For example, the illustrated embodiment appears as a four-sided component from the outside (FIG. 1), while the inside wall (FIG. 2) is generally circular with appropriate location specific changes to accommodate, for example, wafer loading/unloading.

In some embodiments, a sidewall 106 of the chamber 100 includes an opening 120 formed therethrough. The opening 120 provides a channel 122 or other suitable configuration to allow a wafer and/or robot blade to pass from outside of the chamber 100 to the inner volume 105.

The chamber 100 of some embodiments includes a top wall 108. The top wall 108 of some embodiments, as illustrated, supports a sensor lid 110. In some embodiments, the sensor lid 110 and the top wall 108 are a single component. As a single component, the sensor lid 110/top wall 108 of some embodiments is supported on a top of the sidewall 106. The sensor lid 110 of some embodiments includes a cantilever 111 outer edge 112. The cantilever 111 portion rests on a ledge 109 formed in the sidewall 106 at the top wall 108. The sensor lid 110 bounds the inner volume 105 and has an inside surface 114 and an outside surface 116.

A substrate support 150 is within the inner volume 105. The substrate support 150 has a support surface 152 which faces the inside surface 114 of the sensor lid 110. The support surface 152 is configured to hold a wafer during measurement. In some embodiments, the substrate support 150 includes one or more lift pins (not shown) to move the wafer from a support position on the support surface 152 to a loading/unloading position above the support surface 152.

The substrate support 150 is any suitable size depending on the configuration of the chamber 100. In some embodiments, the substrate support 150 is about the same diameter as the wafer to be measured. In some embodiments, the substrate support 150 has a smaller diameter which fits between the tines of a forked robot blade. This configuration allows the robot blade to lift and lower the wafer instead of relying on lift pins.

A sensor bar 130 is connected to the sensor lid 110 by any suitable connection components known to the skilled artisan. In some embodiments, the sensor bar 130 is connected to the sensor lid 110 using a removable connection. For example, the sensor bar 130 of some embodiments is connected to the sensor lid 110 using one or more fastener (e.g., a bolt). In some embodiments, the sensor bar 130 is connected to the sensor lid 110 using a fixed connection. For example, the sensor bar 130 of some embodiments is welded to the sensor lid 110.

The sensor bar 130 of some embodiments comprises a plurality of sensors 140. The sensors 140 are configured to face the support surface 152 of the substrate support 150. The sensors 140 of some embodiments face the support surface 152 and are separated from the support surface 152 by the sensor lid 110. In some embodiments, as shown in FIG. 2, the sensors 140 can "see" the support surface 152 or a wafer on the support surface 152, through an optional lens 142 and aperture 144. The optional lens 142 can be any suitable type of lens or partition known to the skilled artisan. The optional lens 142 of some embodiments is a quartz plate which does not attenuate or focus light passing through the lens 142. In some embodiments, the optional lens 142 is configured to focus or attenuate light passing between the sensor 140 and the inner volume 105.

In some embodiments, the plurality of sensors comprises one or more of reflectometers and/or ellipsometers. In some embodiments, the plurality of sensors comprises one or more reflectometer. In some embodiments, the plurality of sensors comprises one or more ellipsometers. In some embodiments, the plurality of sensors comprises more than one reflectometers and more than one ellipsometers. In some embodiments, the sensors comprise one or more reflectometers. In some embodiments, there are in the range of 3 to 20 reflectometers. In some embodiments, there are in the range of 4 to 16, or 5 to 14, or 6 to 10 reflectometers. In some embodiments, there are in the range of 1 to 6 ellipsometers. In some embodiments, there are 3 or 4 ellipsometers.

Figure 3:
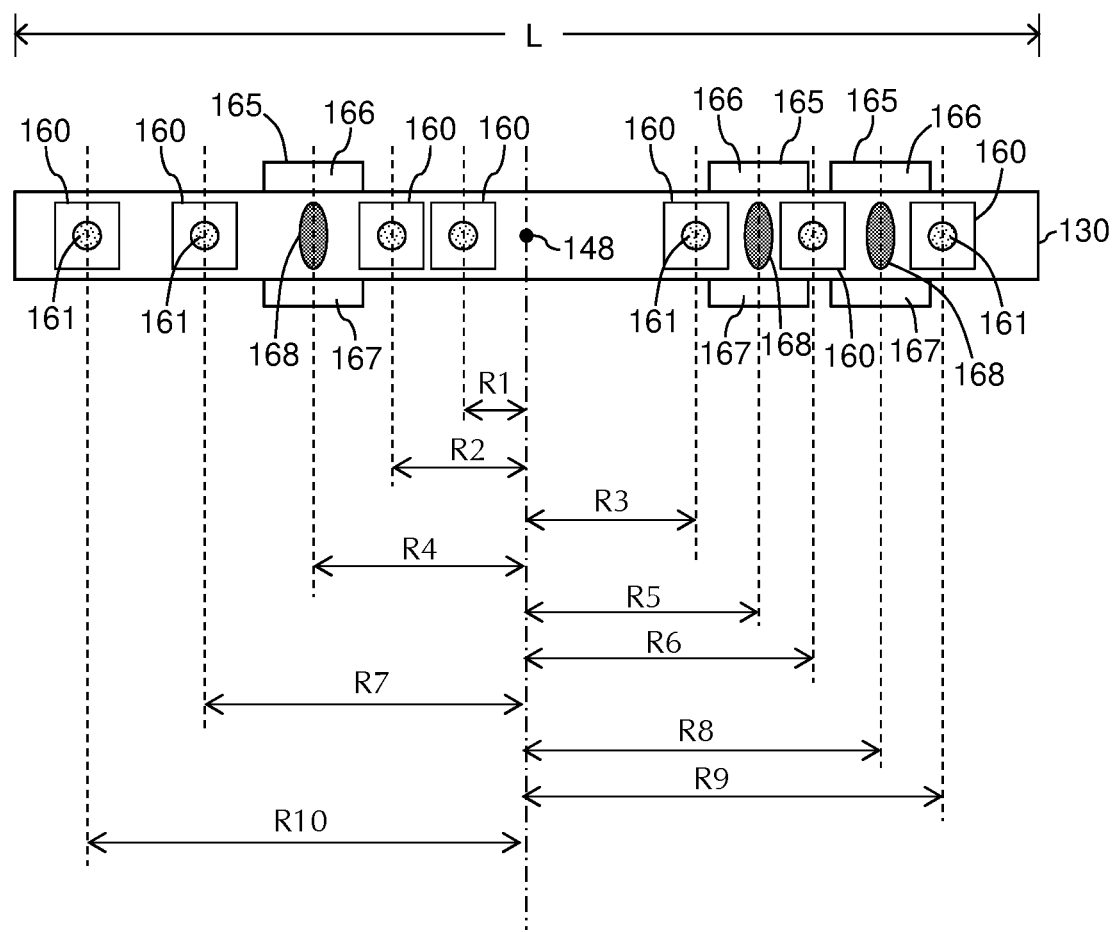
FIG. 3 illustrates a sensor bar according to one or more embodiment of the disclosure.

Referring to FIG. 3, the plurality of sensors 140 are positioned along a length L of the sensor bar 130 at different radii from a central axis 148. The central axis 148 is an imaginary line extending normal to the surface of the sensor bar or the wafer from which the sensors 140 are positioned. The central axis 148 of some embodiments is considered a part of the sensor bar 130. The central axis of some embodiments is considered a part of the substrate support 150. The distance from the central axis 148 to the sensor 140 is considered the radius for any given sensor 140.

For descriptive purposes, the central axis 148 in the drawings is located at a point passing through the sensor bar 130. Each of the sensors 140, of any given type, is positioned at different distances from the central axis 148. The embodiment illustrated in FIG. 3 has a sensor bar 130 with seven reflectometers 160 and three ellipsometers 165. Each reflectometer is configured to measure a region 161 generally aligned with the sensor bar 130. Each ellipsometer is made up of a source 166 and a detector 167 that are positioned a distance apart and angled to measure a region 168 generally aligned with the sensor bar 130. The illustrated embodiment has reflectometers at distances R1, R2, R3, R6, R7, R9 and R10 from the central axis 148, where each of distances R1, R2, R3, R6, R7, R9 and R10 are different. The illustrated embodiment has ellipsometers 165 aligned at distances R4, R5 and R8 from the central axis 148, where each of the distances R4, R5 and R8 are different. In some embodiments, the reflectometers are at radii that are about equally spaced apart, relative to the central axis 148. In some embodiments, the ellipsometers are at radii that are about equally spaced apart, relative to the central axis 148.

The length L of the sensor bar 130 is measured as twice the distance from the central axis 148 to the furthest sensor 140. For example, the length L of the sensor bar 130 in FIG. 3 is 2×R10. In some embodiments, the length L of the sensor bar is larger than the diameter of a wafer to be measured. In some embodiments, the length L of the sensor bar 130 is within ±5% of the diameter of the wafer to be measured. In some embodiments, the length L of the sensor bar 130 is in the range of 50% to 98% of the diameter of the wafer to be measured. For example, if a 300 mm wafer is to be measured, the length of the sensor bar, in some embodiments, is in the range of 150 mm to 294 mm.

The sensor bar 130 can be any suitable shape or configuration and is not limited strictly to rectangular shaped components. In some embodiments, the sensor bar 130 is a rectangular component, as shown in FIG. 3. In some embodiments, the sensor bar 130 is a cruciform shaped component, or other irregular shaped component. The shape of the sensor bar 130 is configured to support the plurality of sensors. In some embodiments, additional sensors are included that are not part of the sensor bar 130. For example, in FIG. 1, the sensor bar 130 has five reflectometers 160. An ellipsometer 165 is separate from the sensor bar 130. In the example of FIG. 3, the ellipsometers 165 are physically connected to the sensor bar 130.

The chamber 100 is configured to rotate one of the sensor bar 130 or substrate support 150 around a central axis 148 relative to the other of the sensor bar 130 or substrate support 150. In some embodiments, the sensor bar 130 is fixed and the substrate support 150 rotates around a central axis 148. In some embodiments, the substrate support 150 is fixed and the sensor bar 130 rotates around the central axis 148.

Referring again to FIG. 1, some embodiments of the disclosure are directed to methods for measuring a property of a substrate using the chamber 100. Some embodiments of the disclosure are directed to methods of measuring a film on a substrate. A substrate support or sensor bar is rotated around a central axis relative to the other of the substrate support or sensor bar and data is collected using at least one sensor positioned on the sensor bar. The at least one sensor is configured to measure the film on the substrate and generate radial-position rotation-angle dependent data profile from each sensor. A property of the film over the substrate is based on the radial-position rotation-angle dependent data profiles.

Figure 4:
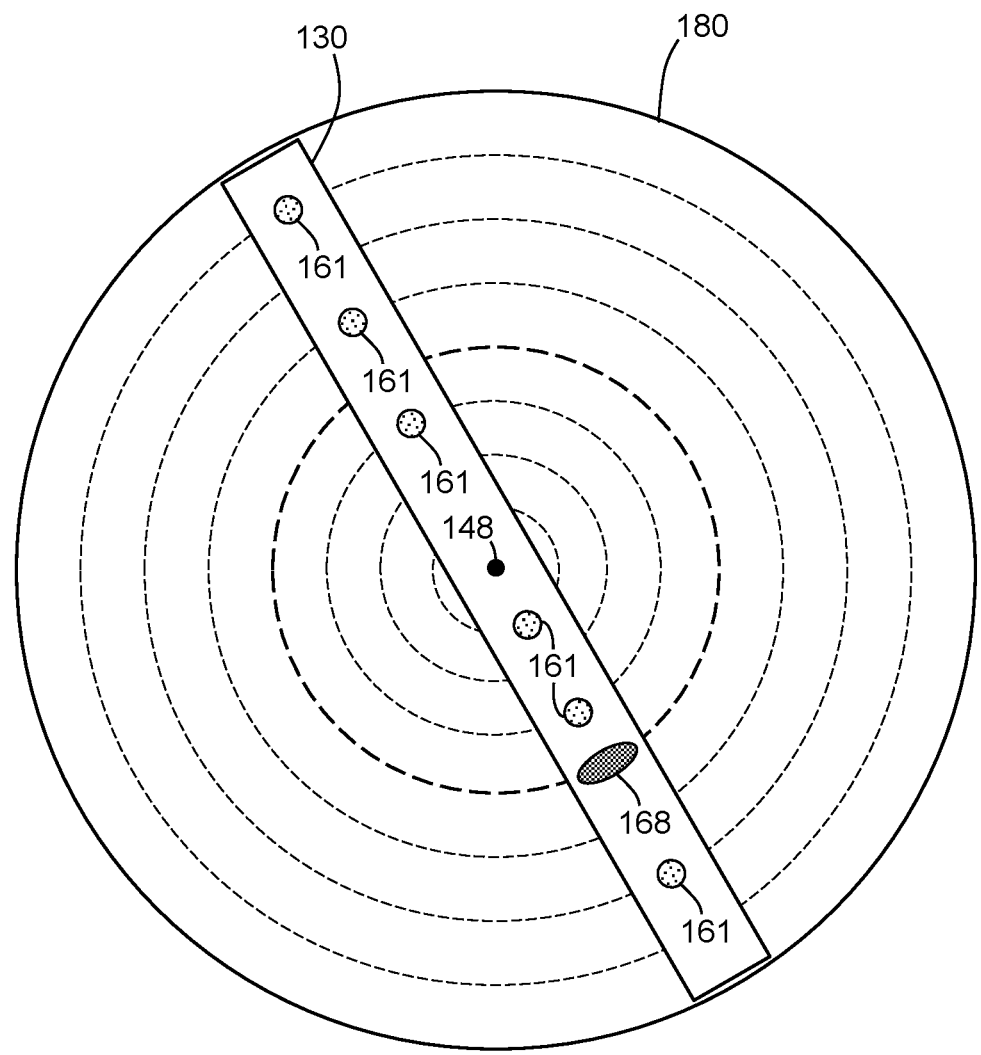
FIG. 4 illustrates a substrate measurement using a sensor bar according to one or more embodiment of the disclosure.

In the embodiment illustrated in FIG. 4, a substrate 180 is rotated around a central axis 148 relative to a sensor bar 130. The length of the sensor bar 130 illustrated is smaller than the diameter of the substrate 180. A plurality of sensors measure the substrate surface or film on the substrate surface, during rotation. The illustrated embodiment includes a total of seven sensors: six reflectometers measuring six regions 161 and one ellipsometer measuring one region 168. Each of the sensors are at different distances from the central axis 148 but the skilled artisan will recognize that different sensor types can be at the same radial distances. For example, in some embodiments, the ellipsometer is at the same radial distance from the central axis 148 as one of the reflectometers so that region 168 and region 161 overlap. In some embodiments, the at least one sensor comprises at least one reflectometer and at least one ellipsometer, each of the reflectometers and each of the ellipsometers positioned at different radii than other reflectometers or ellipsometers, respectively, relative to the central axis.

In some embodiments, the chamber 100 includes at least one controller 190 coupled to one or more of the sensor bar 130, sensors 140, substrate support 150 (including heater 158 and/or rotation shaft 159). In some embodiments, there is more than one controller 190 connected to the individual components and a primary control processor is coupled to each of the separate processors to control the chamber 100. The controller 190 may be one of any form of general-purpose computer processor, microcontroller, microprocessor, etc., that can be used in an industrial setting for controlling various chambers and sub-processors.

In some embodiments, the at least one controller 190 has a processor 192, a memory 194 coupled to the processor 192, input/output devices 196 coupled to the processor 192, and support circuits 198 to communication between the different electronic components. The memory 194 of some embodiments includes one or more of transitory memory (e.g., random access memory) and non-transitory memory (e.g., storage).

The memory 194, or computer-readable medium, of the processor may be one or more of readily available memory such as random access memory (RAM), read-only memory (ROM), floppy disk, hard disk, or any other form of digital storage, local or remote. The memory 194 can retain an instruction set that is operable by the processor 192 to control parameters and components of the chamber 100. The support circuits 198 are coupled to the processor 192 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 190 has one or more configurations to execute individual processes or sub-processes to perform the method. The controller 190 of some embodiments is connected to and configured to operate intermediate components to perform the functions of the methods. For example, the controller 190 of some embodiments is connected to and configured to control one or more of gas valves, actuators, motors, slit valves, vacuum control, sensors, etc.

The controller 190 of some embodiments has one or more configurations selected from: a configuration to move a substrate into or out of the chamber 100; a configuration to rotate one or more of the substrate support or sensor bar around a central axis relative to the other of the substrate support or sensor bar; a configuration to rotate the substrate support around a central axis; a configuration to rotate the sensor bar 130 around a central axis; a configuration to receive data from one or more sensors 140; a configuration to obtain data from a plurality of sensors during rotation of the substrate support to generate a radial-position rotation-angle dependent data profile for each sensor at different radii; a configuration to heat the substrate support; a configuration to measure temperature of the wafer; and/or a configuration to extrapolate data at positions between sensor radii from the radial-position rotation-angle dependent data profiles.

Some embodiments of the disclosure are directed to non-transitory computer readable medium including instructions, that, when executed by a controller of a metrology chamber, causes the chamber to perform one or more operations selected from rotating one of a substrate support or sensor bar around a central axis relative to the other of the substrate support or sensor bar; obtain data from a plurality of sensors during rotation of the substrate support to generate a radial-position rotation-angle dependent data profile for each sensor at different radii; and extrapolate data at a position between sensor radii from the radial-position rotation-angle dependent data profiles. In some embodiments, the plurality of sensors 140 comprise at least one reflectometer 160 and at least one ellipsometer 165 configured to measure a property of a substrate 180 on the substrate support 150, and the non-transitory computer readable medium includes instructions, that, when executed by a controller of the metrology chamber, causes the chamber to further perform one or more operation selected from determining a thickness of a film on a substrate from the radial-position rotation-angle dependent data profiles from one or more of the reflectometer or ellipsometer data; or determining a property (other than thickness) of a film on a substrate from the radial-position rotation-angle dependent data profiles from one or more of the reflectometer or the ellipsometer data.

In some embodiments, the substrate support 150 is configured to rotate around the central axis 148 and the controller 190 is configured to rotate the substrate support at a predetermined rate and collect data from the plurality of sensors 140 during rotation. In some embodiments, the sensor bar 130 is configured to rotate around the central axis 148 and the controller 190 is configured to rotate the sensor bar at a predetermined rate and collect data from the plurality of sensors during rotation.

In some embodiments, one or more sensors 140 are positioned on the sensor bar 130 at radii outside of the diameter of the substrate to be measured. In some embodiments, the controller 190 is further configured to turn off one or more of the sensors 140 so that sensors 140 outside the diameter of the substrate are not used.

The substrate support 150 of some embodiments comprises a thermally insulating material. In some embodiments, a substrate 180 already at an elevated temperature is loaded onto the thermally insulated material of the substrate support 150 and the sensor bar 130 and the radial-position rotation-angle dependent data profiles are measured without additional heating.

In some embodiments, the substrate support 150 further comprises a heater 158 configured to heat the substrate 180 during measurement. In some embodiments, the heater 158 (shown as a heating element) is embedded within a thermally insulated material. In some embodiments, the heater 158 is embedded within a conductive material. As used in this manner, the term "embedded" means that the heater 158 is either surrounded by the substrate support material or at a top surface of the substrate support so that the heater 158 is sandwiched between the substrate 180 and the substrate support 150. In some embodiments, a temperature sensor 153 is positioned to measure a temperature within the inner volume 105. In some embodiments, a temperature sensor 153 is positioned to measure a temperature of the substrate 180 while determining the radial-position rotation-angle dependent data profiles from the sensors 140.

In some embodiments, as shown in FIG. 2, the chamber 100 further comprises a door 185 configured to open and close the opening 120 in the sidewall 106 of the chamber body 102. The door 185 can be any suitable mechanism known to the skilled artisan. For example, the door 185 of some embodiments comprises a slit valve configured to isolate the inner volume 105 of the chamber 100 from a process tool component 186 (e.g., a transfer station or process chamber).

In some embodiments, the chamber 100 includes one or more reference samples 169. In some embodiments, the reference sample 100 is located on or positioned within a surface of the rotating chuck (substrate support 150). In some embodiments, the reference samples 169 provide an internal component to measure and compensate for any chromatic drift in the light source, the detector(s) and the optical paths used to deliver and collect light from the sample. In some embodiments, the substrate support 150 acts as the reference sample 169. For example, the entire surface of the substrate support 150 or the entire substrate support body. Smaller samples could be embedded into the chuck in another implementation. In the illustrated embodiment, the substrate support 150 has a region or area that is configured to act as a reference sample 169. In some embodiments, the reference sample 169 is embedded in the substrate support 150.

In some embodiments, the controller 190 is further configured to analyze a reference sample 169 and provide an attenuation factor representative of changes in one or more of the chromic drift in the light source, detector changes or light path changes (e.g., to windows, lenses, mirrors). In some embodiments, the controller 190 is configured to analyze the reference sample 169 before and/or any particular number of wafer measurements. In some embodiments, the reference sample 169 is measured before and after wafer measurement to provide a real-time attenuation drift during the measurement time-frame. In some embodiments, the reference sample 169 is measured before and after each wafer measurement.

Figure 5:
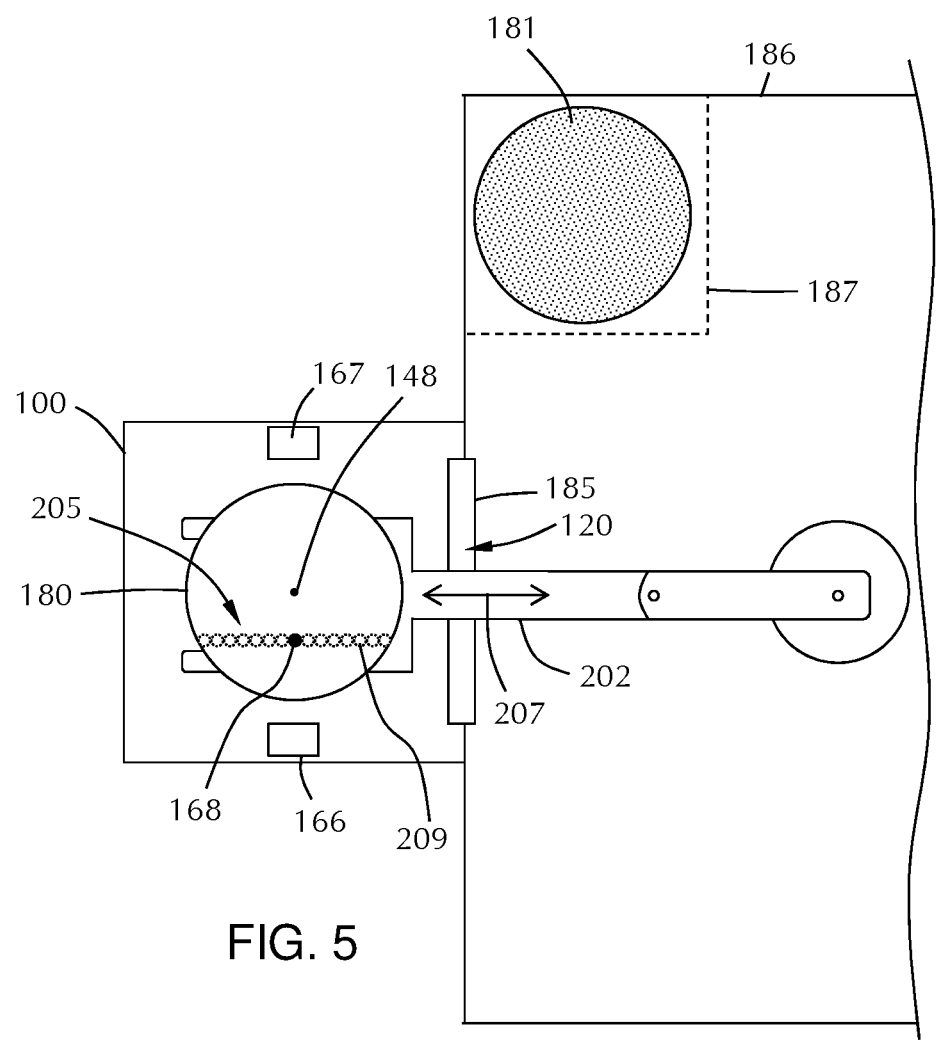
FIG. 5 illustrates a radial/chord measurement according to one or more embodiment of the disclosure.

The reference sample 169 can be any suitable material. Referring to FIG. 5, in some embodiments, a reference wafer 181 is stored within the chamber or process tool. For example, in some embodiments, a reference wafer (e.g., a silicon wafer) is kept in a storage region 187 (e.g., a shelf, an enclosed region) within the process tool component 186 (e.g., mainframe, central transfer station, factory interface). The substrate 180 of some embodiments is loaded into the chamber 100 and measured periodically to create a reference spectrum. In some embodiments, the reference spectrum is used to compensate for any chromatic drift in the light source, the detector(s) and the optical paths used to deliver and collect light from the sample.

The height of the reference sample 169 relative to the sensor lid 110 can be varied. In embodiments where the reference sample 169 is embedded in the substrate support 150 resulting in a height that is equal to or below the support surface 152. A substrate 180 sitting on the substrate support 150 has a top surface closer to the sensors 140 than the support surface 152 of the substrate support 150. Stated differently, a reference sample 169 at the surface of or within the substrate support 150 has a different distance or height than a substrate 180 during measurement. In some embodiments, a reference wafer 181 is positioned on the substrate support 150 at the same height as wafers being measured and will experience comparable sources of optical distortion that affect the reference samples in the chuck differently (e.g. deformation from geometric distortion in the supporting chuck mechanism). In some embodiments, the reference spectra from the reference wafer 181 or reference sample 169 are updated once per day. In some embodiments, the reference spectra form the reference wafer 181 or reference sample 169 is updated more than once per day. In some embodiments, there is more than one day between reference spectra updates.

Some embodiments of the disclosure include a calibration procedure that collects an array of angle-specific reference measurements from a reference sample 169 or reference wafer 181 to compensate for optical distortions which can occur due to wafer pitch and roll during measurement. In some embodiments, the reference wafer 181 or reference sample 169 is rotated around the central axis 148 and measured by the sensor lid. The measurements of some embodiments are used as a baseline, background or reference spectrum for the sample measurements.

Some embodiments include a displacement sensor 154 to measure and compensate for non-repeatable sources of wafer height and angle (e.g. pitch and roll) during wafer rotation. In the illustrated embodiment in FIG. 2, the displacement sensor 154 is located on and/or in the substrate support 150. The skilled artisan will recognize that the placement of the displacement sensor 154 can be any suitable location depending on the sensor. In some embodiments, one or more sensors are included to independently measure variations in wafer height and angle. In some embodiments, the angle measurements account for pitch and roll of the wafer. In some embodiments, concentric or simultaneous measurements of tilt and height per measurement channel are recorded. For example, covering more complex variations in topology vs. simple pitch and role, and tilt of the sample. In some embodiments, variations in sample angle and height originating from a wavy substrate surface are accounted for. In some embodiments, triangulation sensors are used to measure displacement. In some embodiments, the tilt/angle measurements are performed at multiple points differentially where changes in height are common to all points. For example, phase imaging can be used to provide spatial displacement content where the displacement is common to all data pixels (channels) and extracted as height. In some embodiments, non-optical techniques (e.g., an inclinometer) can be used to directly measure wobble of the rotating pedestal without any sensitivity to height. An inclinometer on the pedestal may not capture all variations in angle due to variations in the shape/contour of the wafer. The pedestal-based inclinometer of some embodiments is used to compensate for pedestal wobble as the dominant source of angular variations.

In some embodiments, data from the temperature sensor 153 is used to compensate for variations in substrate temperature which can affect the optical properties of a cooling substrate. Changes in substrate temperature will affect the refractive index (n) and the actual and perceived thickness of films as measured with an optical sensor. In some embodiments, the controller 190 is configured to measure temperature of the substrate during film thickness measurements and compensate for the perceived thickness based on temperature fluctuations.

In some embodiments, the sensor bar 130 or reference sample 169 includes a dedicated reference fiber (not shown) to measure a sample of known reflectance which follows the path of the measurement fibers. The fiber of some embodiments experiences comparable mechanical stresses and associated optical distortion to the measurement fiber. The fiber will also experience the dominant, common sources of variation from a suitably homogenized light source and in some embodiments is used to compensate for common variations in source light and for mechanically-induced variations in optical fibers delivering and collecting light from the wafer sample.

Some embodiments incorporate a light distribution system with optical elements (e.g. light pipe or diffuser) to homogenize light distributed across multiple light delivery channels distributed evenly around a common light source. For example, each of the reflectometers 160 in FIG. 3, in some embodiments, shares a common light source and each reflectometer 160 has an independent detector.

In some embodiments there is one ellipsometer 165 that measures a point at a fixed distance from the central axis 148. When the substrate 180 is rotated on the substrate support 150, ellipsometer 165 measurements are generated for a circular path around the central axis 148 at a fixed distance, as shown in FIG. 4.

Referring again to FIG. 5, in some embodiments, a robot blade 202 (or other component capable of moving a substrate 180 into or out of the chamber 100) is used as a transport mechanism to create a radial/chord scan of the substrate 180 using the ellipsometer 165. The skilled artisan will recognize that this measurement type is not limited to ellipsometers 165, and that other sensors (e.g., reflectometers) can be used to create a chord scan of the wafer. A radial/chord scan 205 of the substrate 180 in some embodiments is performed by moving the substrate 180 along a path 207 into and/or out of the chamber 100. During movement of the substrate 180 into and/or out of the chamber 100, in some embodiments, ellipsometer 165 measurements are recorded at continuously or at multiple points creating a chord of data. In FIG. 5, the radial/chord scan 205 of the substrate 180 is illustrated as a linear grouping of distinct measurement points 209 with the region 168 being actively measured shown as a solid point. In some embodiments, movement of the substrate 180 into the chamber 100 exceeds the distance to center the substrate on the substrate support 150 to allow measurements of all points along the radial/chord scan 205.

The embodiment illustrated in FIG. 5 shows the radial/chord scan 205 as a geometric chord. A geometric chord is a straight line segment with endpoints on the circle. In this disclosure, a chord is any measurement or series of measurements that extends in a path that varies in distance along the path relative to the central axis 148. As used this disclosure and the appended claims, a chord can begin and/or end within the field of the substrate and is not limited to beginning and/or ending at the edge of the substrate.

FIG. 4 illustrates a series of concentric measurements which have a uniform radius around and relative to the central axis 148. The radial/chord scan 205 of FIG. 5 is a linear path with each measurement point 209 at a different distance from the central axis 148.

Figure 6A:
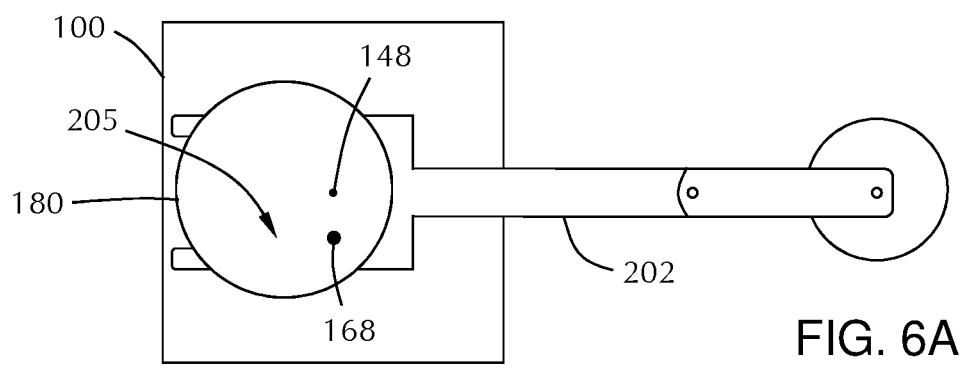
FIGS. 6A through 6D illustrate a process for generating a radial/chord measurement according to one or more embodiment of the disclosure.
Figure 6B:
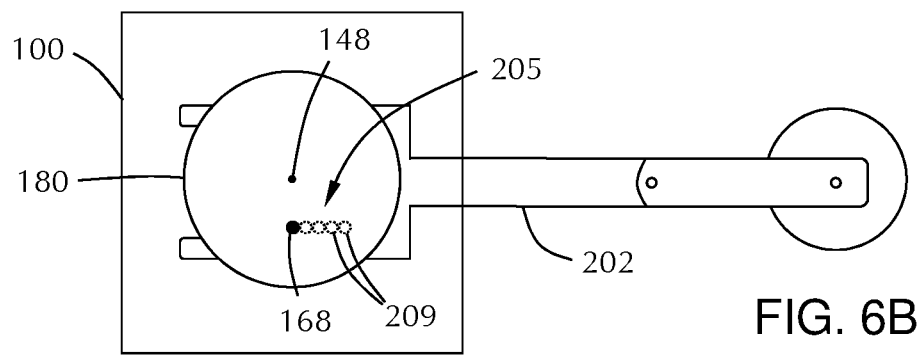
Figure 6C:
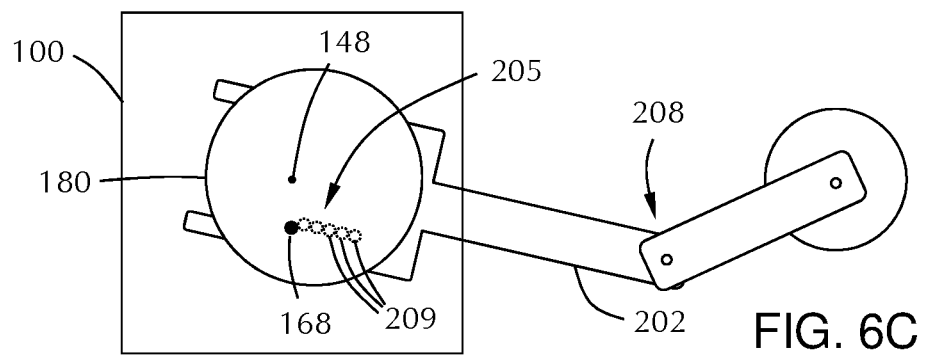
Figure 6D:
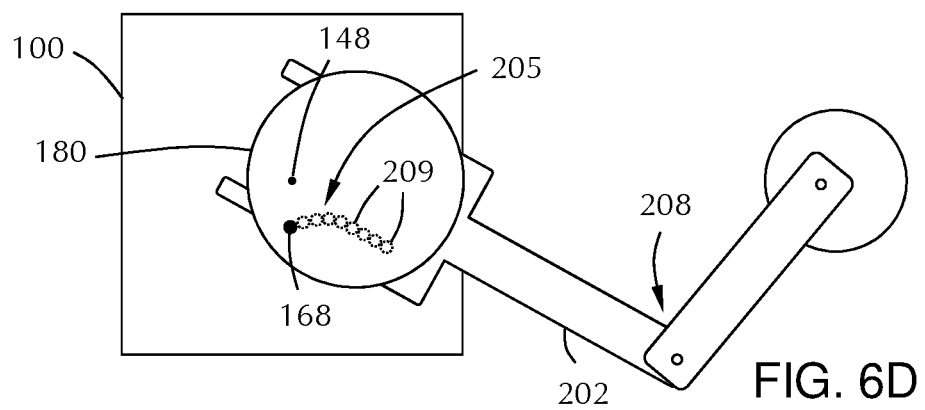

In some embodiments, the sensors 140 are synchronized with the rotation of the substrate support 150. For example, the data encoder of some embodiments is synchronized with the optical measurements of the moving substrate 180. In some embodiments, movement of the substrate 180 into and/or out of the chamber 100 creates a radial/chord scan 205 with a non-linear path due to relative rotation of the substrate 180 as the robot blade 202 is retracted. FIGS. 6A through 6D illustrate a process in which the substrate 180 rotates during portions of the measurement so that the radial/chord scan 205 follows a curved path. The central axis 148 and measurement region 168 remain in a fixed position within the chamber 100 throughout FIGS. 6A through 6D. In FIG. 6A, the robot 202 is extended to a first distance into the chamber 100 and a region 168 is measured. In FIG. 6B, the robot 202 has retracted linearly so that a line of measurement points 209 is formed. Each of these measurement points 209 were recorded when the respective measurement point 209 was at the measurement region 168. FIG. 6B shows a total of five measurement points 209, including the point at the measurement region 168. FIG. 6C shows the robot arm starting to bend at the elbow 208 to maintain a linear path for the substrate 180 during unloading of the chamber 100. The bending elbow 208 causes the substrate 180 to rotate relative to the central axis 148 and measurement region 168 so that measurement point taken at measurement region 168 is not collinear with the measurement points 209 in FIG. 6B. FIG. 6D shows the robot arm further bent at the elbow 208 to maintain the linear path of the substrate 180 during unloading. The substrate 180 has further rotated relative to the central axis 148 and measurement region 168 so that the radial/chord scan 205 is not linear from end to end. The radial/chord scan 205 illustrated in FIG. 6D is considered a chord according to this disclosure. The embodiment illustrated in FIGS. 6A through 6D is merely illustrative of one possible configuration and the skilled artisan will recognize that the particular movement of the robot 202 and substrate 180 rotation can be changed and that the order of measurements (e.g., during loading vs. unloading) can be modified.

In some embodiments, the distance of the substrate 180 to the sensors 140 remains substantially uniform throughout the rotation around the central axis 148 (as shown in FIG. 4), or along the movement path (as shown in FIGS. 6A through 6D) at the measurement point 168. As used in this manner, the term "substantially uniform" means that the distance does not vary by more than 5% relative to the average distance. In some embodiments, the distance from the substrate 180 to the sensors 140 varies during rotation around the central axis 148 or along the movement path at the measurement point 168. In some embodiments, a distance sensor is within the chamber 100 to allow for determination of the path length for the measurements. In some embodiments, the controller is configured to determine a correction factor to account for changes in the path length.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. An in-situ metrology chamber comprising:
   a chamber body having a bottom and sidewalls bounding an inner volume, the sidewalls having an opening formed therethrough;
   a sensor lid bounding the inner volume, the sensor lid having an inside surface and an outside surface;
   a substrate support within the inner volume, the substrate support having a support surface facing the inside surface of the sensor lid;
   a sensor bar connected to the sensor lid, the sensor bar comprising a plurality of sensors facing the support surface of the substrate support, the plurality of sensors positioned along the sensor bar at different radii from a central axis; and
   a door configured to open and close the opening in sidewalls,
   wherein one of the sensor bar or substrate support is configured to rotate around a central axis relative to the other of the sensor bar or substrate support.

2. The chamber of claim 1, further comprising a controller connected to one or more of the plurality of sensors or the substrate support.

3. The chamber of claim 2, wherein the substrate support is configured to rotate around the central axis.

4. The chamber of claim 3, wherein the controller is configured to rotate the substrate support at a predetermined rate and collect data from the plurality of sensors during rotation.

5. The chamber of claim 2, wherein the sensor bar is configured to rotate around the central axis.

6. The chamber of claim 5, wherein the controller is configured to rotate the sensor bar at a predetermined rate and collect data from the plurality of sensors during rotation.

7. The chamber of claim 1, wherein the plurality of sensors comprise one or more reflectometers.

8. The chamber of claim 7, wherein there are in the range of 3 to 20 reflectometers.

9. The chamber of claim 7, wherein there are in the range of 6 to 10 reflectometers.

10. The chamber of claim 1, wherein the plurality of sensors comprise one or more ellipsometers.

11. The chamber of claim 10, wherein there are in the range of 1 to 6 ellipsometers.

12. The chamber of claim 10, wherein there are 3 or 4 ellipsometers.

13. The chamber of claim 1, wherein the substrate support further comprises a heater.

14. The chamber of claim 13, further comprising at least one temperature sensor configured to measure a temperature of a substrate on the substrate support.

15. A non-transitory computer readable medium including instructions, that, when executed by a controller of a metrology chamber, causes the chamber to perform one or more operations selected from: rotating one of a substrate support or sensor bar around a central axis relative to the other of the substrate support or sensor bar; obtain data from a plurality of sensors during rotation of the substrate support to generate a radial-position rotation-angle dependent data profile for each sensor at different radii; and extrapolate data at a position between sensor radii from the radial-position rotation-angle dependent data profiles, wherein the plurality of sensors comprise at least one reflectometer and at least one ellipsometer configured to measure a property of a substrate on the substrate support, and the instructions cause the chamber to further perform one or more operations selected from: determining a thickness of a film on a substrate from the radial-position rotation-angle dependent data profiles.

16. A method of measuring a film on a substrate, the method comprising:
rotating one of a substrate support or sensor bar around a central axis relative to the other of the substrate support or sensor bar;
collecting data from the substrate using at least one sensor positioned on the sensor bar, the at least one sensor configured to measure the film on the substrate and generate radial-position rotation-angle dependent data profile from each sensor; and
determining a property of the film over the substrate based on the radial-position rotation-angle dependent data profiles,
wherein the at least one sensor comprises at least one reflectometer and at least one ellipsometer, each of the reflectometers and each of the ellipsometers positioned at different radii than other reflectometers or ellipsometers, respectively, relative to the central axis.

17. The chamber of claim 1, wherein the substrate support comprises a thermally insulating material.

* * * * *